United States Patent
Serizawa et al.

(10) Patent No.: US 6,257,898 B1
(45) Date of Patent: Jul. 10, 2001

(54) MOUNTING STRUCTURE FOR FLAT CIRCUITRY

(75) Inventors: Yasuyoshi Serizawa; Kenji Iwasaki, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/625,952

(22) Filed: Jul. 26, 2000

(30) Foreign Application Priority Data

Jul. 28, 1999 (JP) .................................................. 11-214225

(51) Int. Cl.⁷ .................................................... H01R 33/00
(52) U.S. Cl. ............................ 439/34; 174/135; 248/74.4; 248/74.2
(58) Field of Search ............................... 174/61, 63, 52.4, 174/72 A, 117 F, 117 FF, 135, 136; 248/74.1, 74.2, 74.4, 316.6; 439/34

(56) References Cited

U.S. PATENT DOCUMENTS

| | | | |
|---|---|---|---|
| 2,913,740 | * 11/1959 | Eldridge | 174/315 |
| 4,155,613 | * 5/1979 | Brandeau | 439/90 |
| 5,367,126 | * 11/1994 | Kikuchi | 174/71 |
| 5,445,348 | * 8/1995 | Caldwell et al. | 248/74.1 |
| 5,962,814 | * 10/1999 | Skipworth et al. | 174/135 |

FOREIGN PATENT DOCUMENTS 8-198036    8/1996   (JP) .

* cited by examiner

*Primary Examiner*—Khiem Nguyen
*Assistant Examiner*—Thanh-Tam Le
(74) *Attorney, Agent, or Firm*—Morgan, Lewis & Bockius LLP

(57) ABSTRACT

In a flat circuitry mounting structure for connection of one end portion of a flat circuitry that is mounted with a surplus length between a molded panel and a body panel at a position in a vehicle, the flat circuitry is supported by a flexible support member that is mounted on a back face of the door trim in such manner that one end in a longitudinal direction thereof is fixed while the other end is free.

3 Claims, 4 Drawing Sheets

MOUNTING STRUCTURE FOR FLAT CIRCUITRY

BACKGROUND OF THE INVENTION

The present invention relates to a mounting structure for a flat circuitry used for various kinds of electric equipments, such as a power window mechanism of a vehicle door.

Wire harnesses are usually wired in a space between an inner panel and a door trim to constitute electric circuits for carrying a switch on/off signal, an operation signal or the like to various electric equipments equipped on vehicle doors. In recent years, in place of conventional wires, cables and wire harnesses, a thin-and-flat flexible printed circuitry (hereinafter referred to as an FPC) has attracted attention, which is a flat circuitry that is excellent in operational efficiency at being handled for installation in spaces with its elasticity and flexibility. The FPCs are molded of resin, such as polyethylene terephthalate (PET).

To attach the FPC inside a vehicle door, one end portion of the FPC, for instance, is connected to a switch unit of electric equipment while the other end portion is connected to a wire harness on the inner panel side or another circuit, such as a door control unit that is an electronically controlled unit (ECU).

FIG. 4 shows an outline of a case of operation to attach the FPC. A switch unit 2 for on-off switching operation of various electrical equipments by a driver or passengers is mounted on the internal side of a door trim 1 (inside of the vehicle) is installed. An end portion of the lead wire part of the FPC 3 is connected to a switching circuit board section (a printed circuit board: PCB) of the switch unit 2. On the other hand, a door control unit 8 is mounted on an inner panel 7 on a door panel 5 side that is equipped with such as window glass 6, and the other end portion of the lead wire part of the FPC 3 is connected to the door control unit 8 via an electric connector 4.

After completion of the mounting operation, switch on-off signals are input from the switch unit 2 to the door control unit 8 via the electric connector 4 while control signals, such as an actuating signal, are output from the door control unit 8 to the various electric equipments.

Japanese Patent Publication No. 8-198036A discloses another example of the related operation to attach the flat circuitry. In this case, the flat circuitry is arranged on the lower face of the door panel and then the lead wire part of the flat circuitry that is connected to the switch unit is drawn out downward.

In the related operation to attach the FPC 3, as shown in FIG. 4, when a worker assembles the door panel that includes the door trim 1, an inner panel 6 and an outer panel 9 after connection of the electric connector 4 by insertion into the door control unit 8, there may be caught a surplus length part 3a of the FPC 3 between the panels. The FPC caught between the panels may cause such a trouble as deformation, and sometimes even a wire break can be caused. This can happen also in the operation to attach the flat circuitry in the above publication.

SUMMARY OF THE INVENTION

Therefore, an object of the invention is to provide a flat circuitry mounting structure that can avoid the trouble of deformation and wire break in the circuitry during assembly work of the door panel that includes the door trim and the inner and outer panels when the flat circuitry, such as the FPC, which constitutes the electric circuit for various electrical equipments that are equipped on and around the door.

In order to achieve the above object, according to the present invention, there is provided a structure for mounting a flat circuitry between a molded panel and a body panel of a vehicle while providing a surplus length portion of the flat circuitry, comprising:

a base member provided on the molded panel; and
a support strip member including:
   a fixed end portion for fixing a first part of the flat circuitry on the base member;
   a free end portion for retaining a second part of the flat circuitry which is in the vicinity of an end portion of the flat circuitry to be connected to the body panel; and
an elastic main body connecting the fixed end portion and the free end portion so as to extend along a portion of the flat circuitry between the first and second part thereof such that a portion of the flat circuitry between the second part and the end portion thereof becomes the surplus length portion.

Preferably, the molded panel is a door trim and the body panel is a door panel. The flat circuitry connects a first circuit unit provided on the door trim and a second circuit unit provided on the door panel via a connector provided on the end portion of the flat circuitry.

In this case, the flat circuitry is supported by the elastic support strip member over approximately the full length. Since the flat circuitry is forced to return to a former posture when the elastic support member recovers a former shape from the flexed state in the course of assembly of the molded panel after the connector is connected to another circuit on the body panel side with the flat circuitry being drawn while the elastic support member is being flexed, the surplus length part of the flat circuitry can be prevented from being caught between the panels after assembly of the molded panel.

According to the present invention, there is also provided a method for mounting a flat circuitry between a molded panel and a body panel of a vehicle while providing a surplus length portion of the flat circuitry, comprising the steps of:

preparing an elastic strip member;
fixing a first part of the flat circuitry onto the molded panel with a first end portion of the strip member; and
retaining a second part of the flat circuitry which is in the vicinity of an end portion of the flat circuitry to be connected to the body panel with a second end portion of the strip member such that a portion of the flat circuitry between the second part and the end portion thereof becomes the surplus length portion.

DETAILED DESCRIPTION OF THE PREFERRED EMBODIMENTS

With references to the drawings, the following describes in detail on an embodiment of the invention that concerns the flat circuitry mounting structure. The same signs are given to the members that are common to the ones in FIG. 4 that is an embodiment of the related art.

Figure 1A:
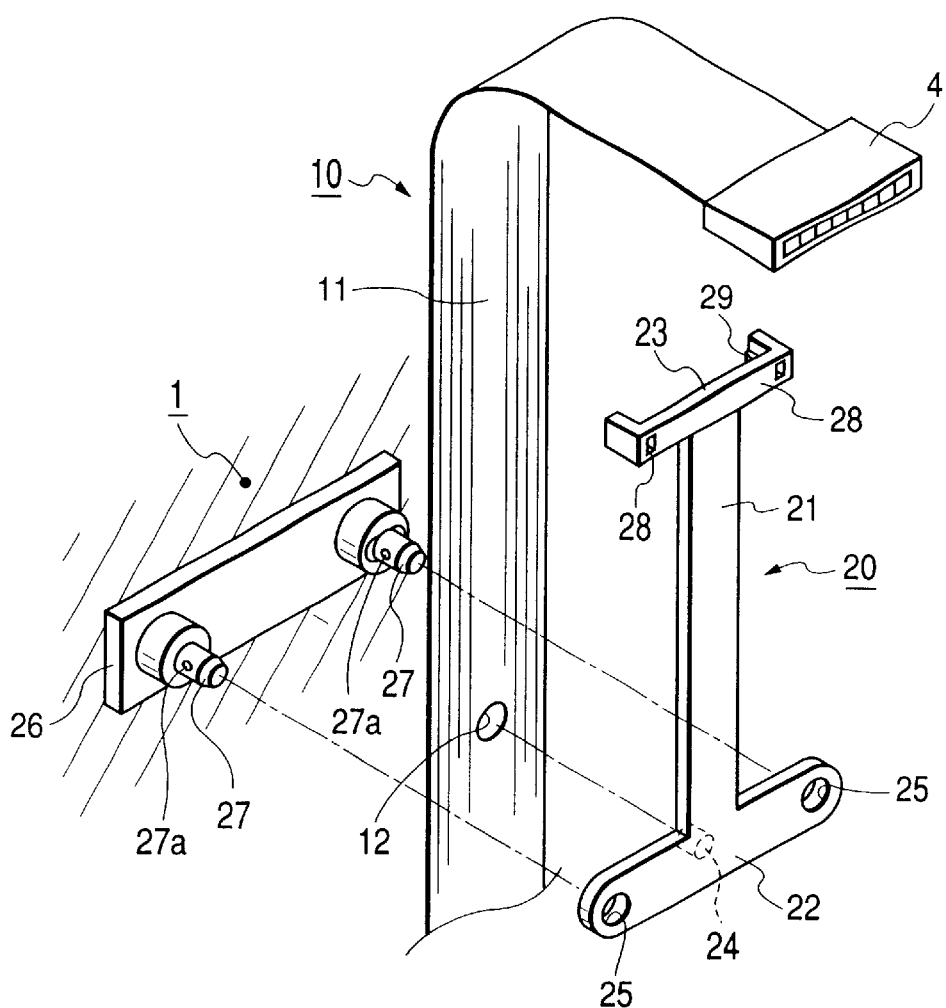
FIG. 1A is a perspective view showing a flat circuitry mounting structure according to one embodiment of the present invention.
Figure 1B:
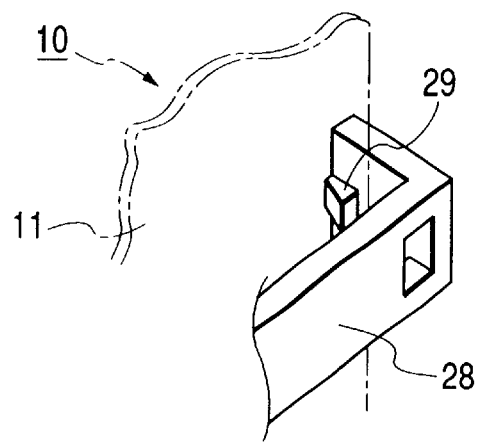
FIG. 1B is a partial enlarged perspective view of the mounting structure shown in FIG. 1A.

FIGS. 1A and 1B show a perspective view and a partial enlarged perspective view of the flat circuitry mounting structure of this embodiment to be assembled to the vehicle door. A circuit section 11 of an FPC (flexible printed circuit) strip 10 includes a switching circuit board section serves as a switch unit 2 and a lead wiring section drawn out from the switching circuit board part to an electric connector 4 as an integrated pattern. One end portion of a circuit of the circuit section 11 is connected to the switch unit 2, and the other end portion of the circuit is connected to the electric connector 4. The circuit section 11 is formed in a shape of strip that has a necessary length, and an engagement hole 12 is provided in an appropriate place thereof.

The FPC 10 that is drawn out to the back side of a door trim 1 is supported in a space between the door trim 1 and an inner panel 7, aided by the elastic, soft resin support member 20 that is an essential member of the invention, and mounted upright in this case, as shown in the figure.

In the elastic support member 20, a main body 21 is molded in a shape of vertical narrow strip to facilitate moderate flexure. At the upper and lower end portions of the main body 21, brackets 22 and 23 protrude respectively on both sides in a shape of horizontal top and bottom crossbars. A lock pin 24 is formed at a midpoint of the bracket 22 as an integral part thereof on the lower end portion in a shape of projection, and two engagement holes 25 are formed at the both ends. The lock pin 24 is provided for fastening of the circuit section 11 of the FPC 10 to the main body 21 of the elastic support member 20 when fitted into the engagement hole 12 that penetrates the circuit section 11. The two engagement holes 25 is provided for fastening of the lower end portion of the main body 21 of the elastic support member 20 to the back face of the door trim 1 when fitted onto fastening pins 27 that are provided on the back face of the door trim 1 and in such manner as to protrude through a bracket 26.

The upper end portion of the elastic support member 20 where the bracket 23 is provided is a free end. As shown in FIG. 1B, clamp holders composed of arm portions 28 and clamp projections 29 are provided at both ends of the bracket 23. The clamp holders clamp the upper end portion, which is the other end of the circuit section 11 of FPC 10, in the thickness direction of the FPC 10 to support the same.

With the above-described structure, the FPC 10 is mounted as follows while being supported by the elastic support member 20.

When a switch unit 2 to be operated by a driver or a passenger is assembled at an inside position of the door trim 1, the FPC 10 is prepared in a half-assembled state wherein the one end portion is connected to the switch unit 2. Approximately the full length of the circuit section 11 of the FPC 10 and the electric connector 4 provided on the other end portion thereof are drawn out to the back side of the door trim 1. Connection to the other circuits (a door control unit 8 in this case) arranged on the inner panel 7 on the door panel 5 side via the electric connector 4 is ready in this state.

Figure 2:
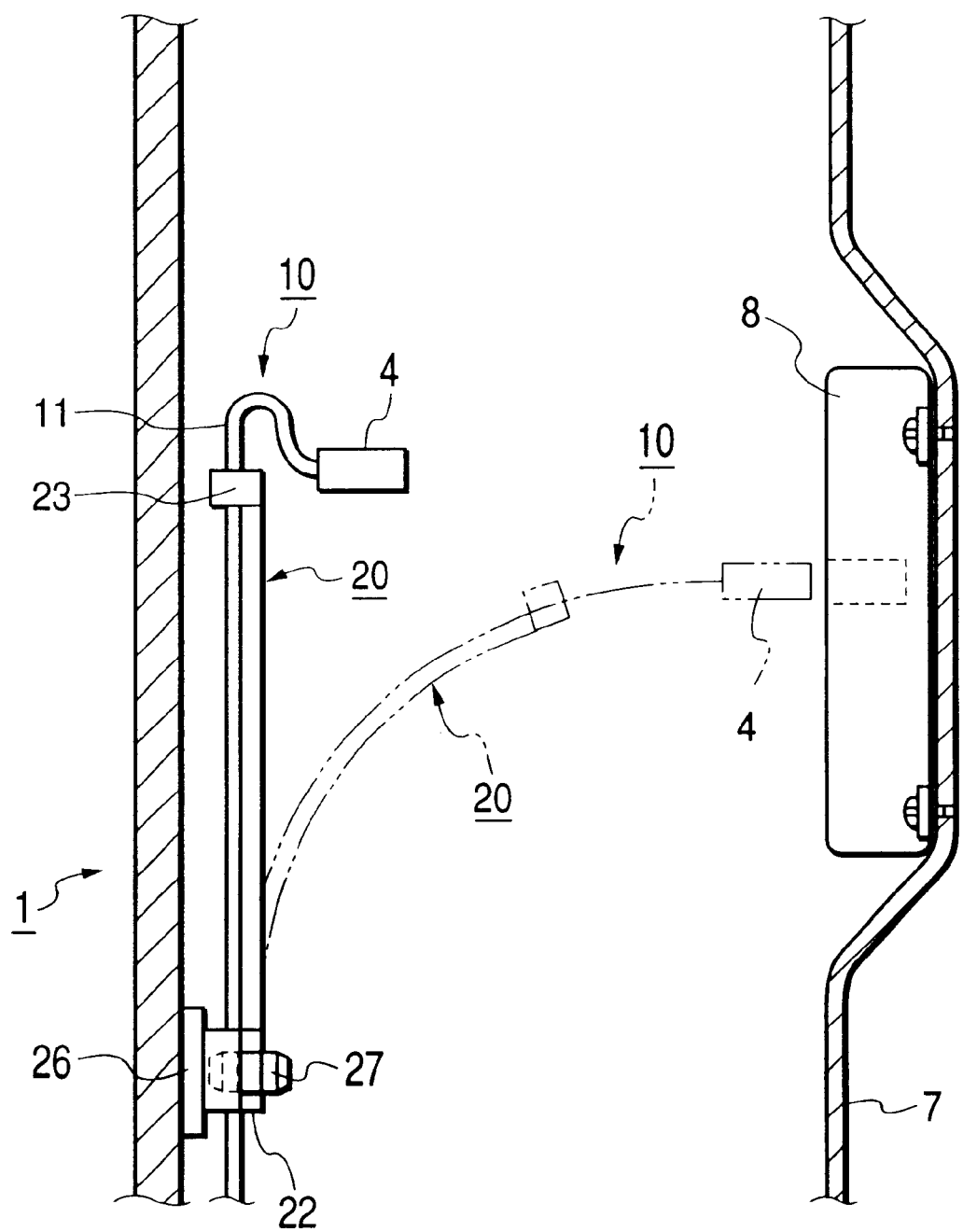
FIG. 2 is a sectional side view showing how an FPC is connected to a back side of a door trim according to the present invention.
Figure 3:
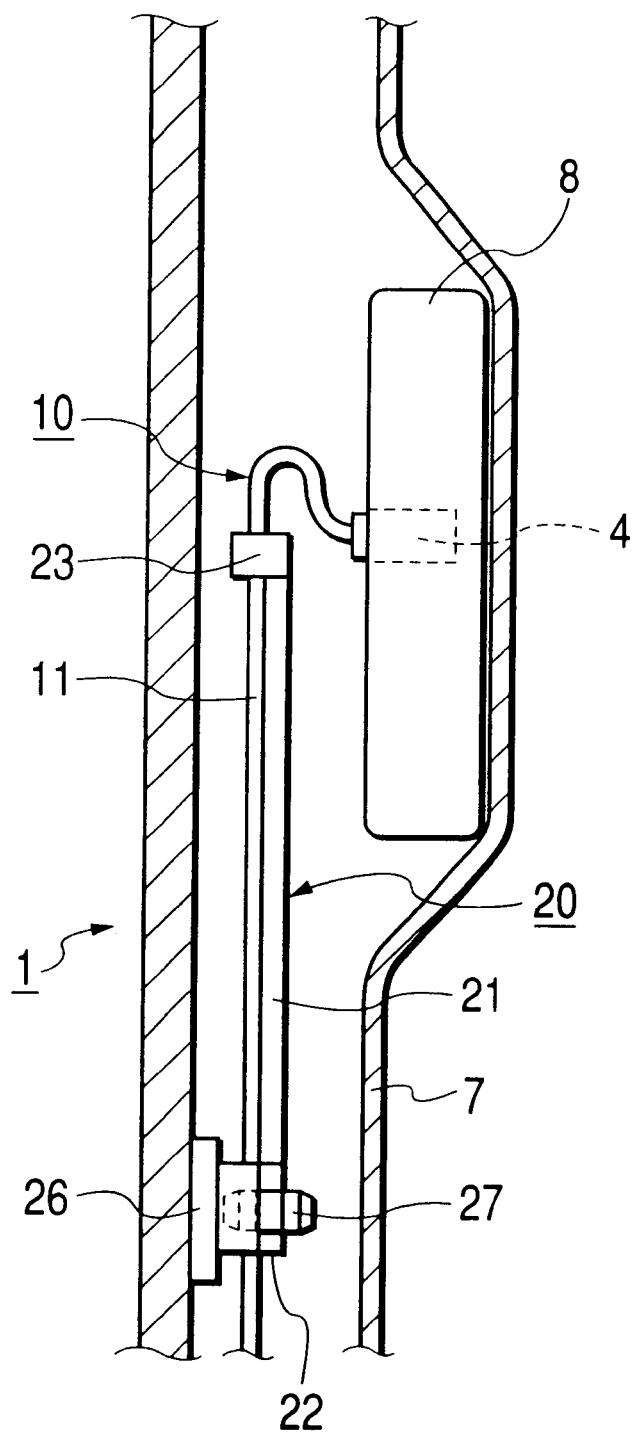
FIG. 3 is a sectional side view showing a state the FPC is connected to the back side of the door trim.

As shown in FIG. 2, in the space between the inner panel 7 and the back face side of the door trim 1, the main body 21 of the elastic support member 20 is fastened when the engagement holes 25 thereof in the lower end portion bracket 22 are fitted onto the fastening pins 27 on the back face of the door trim 1. As shown in FIG. 1A, the lower end portion of the circuit section 11 is supported by the elastic support member 20 when the lock pin 24 of the bracket 22 is fitted into the lock pin 12 in the circuit section 11. In addition, on the upper end portion of the main body 21 of the elastic support member 20, the clamp holder composed of the arm portions 28 and the clamp projections 29 that are formed at the bracket 23 clamps and supports the upper end portion of the circuit section 11. Only the electric connector 4 on the other end portion of the circuit section 11 is free in preparation for the connection to the door control unit 8 on the inner panel 7 side.

At the next step, in a case where the FPC circuitry 10 is drawn together with the elastic support member 20 by a worker when the electric connector 4 is connected to the door control unit 8, as shown in a phantom line in FIG. 2, even the elastic support member 20 is flexed into a shape of arch by the tractive force, it protects the FPC circuitry 10 from direct work of the tractive force. The electric connector 4 is inserted into and connected with the door control unit 8 in the flexed state.

Figure 4:
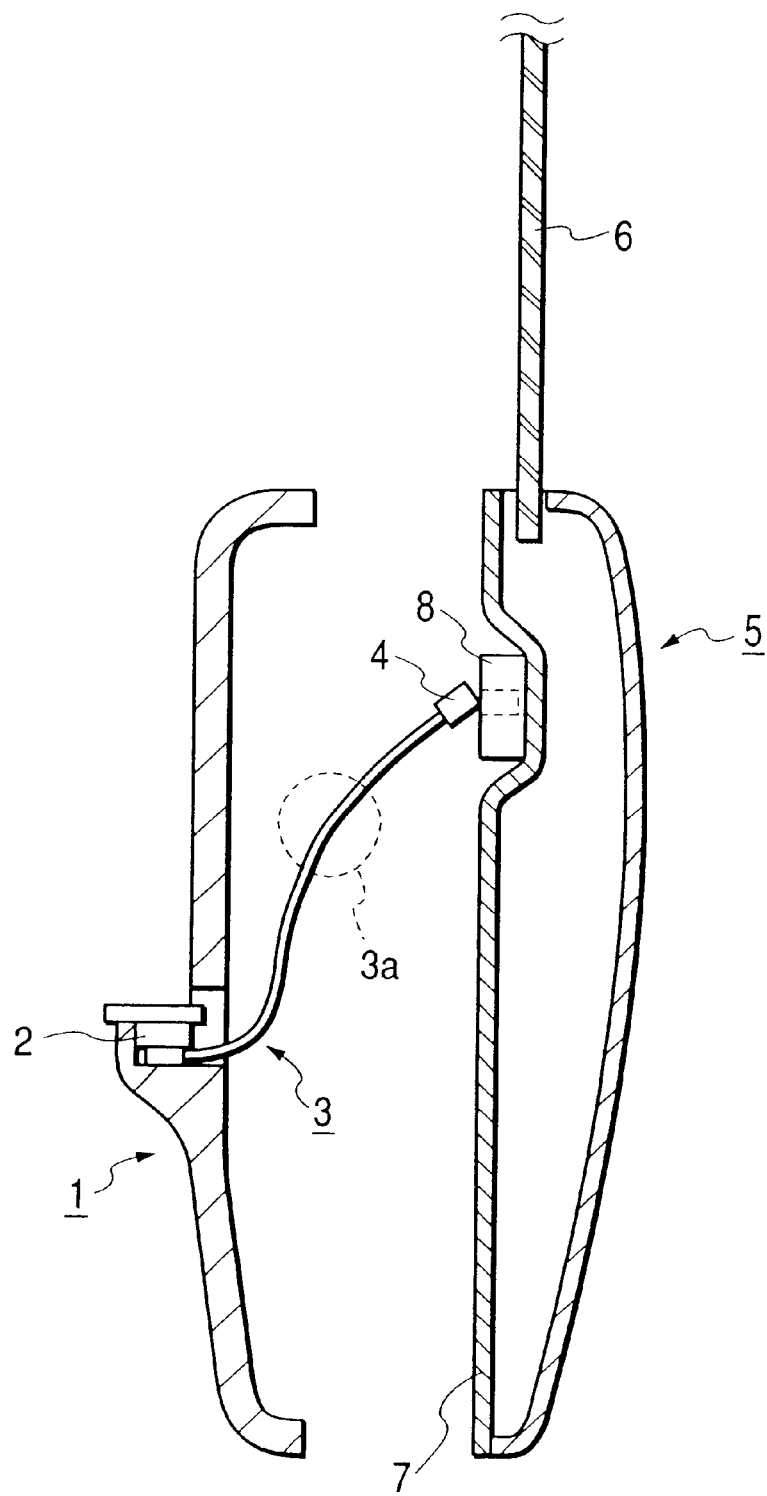
FIG. 4 is a sectional side view showing how an FPC is connected to a back side of a door trim according to a related way.

After the connection, the door panel 5 that includes the door trim 1 and the inner and outer panels 7 and 9, is assembled, as shown in FIG. 4. When the panel is assembled, the main body 21 of the elastic support member 20 in the flexed state tends to return to the original shape by the elasticity and the FPC circuitry 10 is forced to follow the restoring action and controlled to restore the original standing posture, as shown by a solid line in FIG. 2.

Since the posture of the FPC 10 is properly controlled with aid of the elastic support member 20, a surplus length part 3a of the circuit section 11 in FIG. 4 will not be caught between the panels after assembly of the door panel and thus the deformation and wire break of the circuit section 11 can be prevented.

As described above, in the FPC 10 includes the switching circuit board section serves as the switch unit 2 and the lead wiring section drawn out from the switching circuit board part to the electric connector 4 as an integrated pattern. On the other hand, in the FPC of the related flat circuitry, since the switching circuit board section and the lead wiring section are formed as separate units and connected via a connector or the like, the damage on the connector engagement part and the eventual wire break may be caused by the traction force of the worker, as described above. In this respect, the circuit section 11 in this embodiment, which is the single piece of unit whereon the switching circuit board section of the switch unit 2 and the lead wiring section are formed as the pattern, wherein approximately the full length of the simple circuitry is supported by the elastic support member, is advantageous with facilitation of protection from being caught during the panel assembly and effective prevention of the above-mentioned damage and wire break.

Although the FPC 10 of this embodiment is described with the case of operation to be mounted on the vehicle door, this is not limited to the vehicle door but applicable to any position where the flat circuitry is mounted. Moreover, although the above-described case concerns the FPC that is drawn out from the switch unit 2, the invention is applicable to a part of branching from the flat wire harness beside the present unit.

Furthermore, although the above-described embodiment of the invention concerns the mounting of the flat circuitry from the door trim to the inner panel, the invention is not limited to the above-described embodiment but applicable to the mounting of the flat circuitry where a standard circuit for electrically connecting a standard electric instruments equipped on a molded panel such as an instrument panel of a vehicle, and an electric equipments or the other electric equipments such as a control unit mounted on the vehicle main body side, via a connector for wire harness.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A structure for mounting a flat circuitry between a molded panel and a body panel of a vehicle while providing a surplus length portion of the flat circuitry, comprising:
    a base member provided on the molded panel; and
    a support strip member including:
        a fixed end portion for fixing a first part of the flat circuitry on the base member;
        a free end portion for retaining a second part of the flat circuitry which is in the vicinity of an end portion of the flat circuitry to be connected to the body panel; and
        an elastic main body connecting the fixed end portion and the free end portion so as to extend along a portion of the flat circuitry between the first and second part thereof such that a portion of the flat circuitry between the second part and the end portion thereof becomes the surplus length portion.

2. The mounting structure as set forth in claim 1, wherein the molded panel is a door trim and the body panel is a door panel; and
    wherein the flat circuitry connects a first circuit unit provided on the door trim and a second circuit unit provided on the door panel via a connector provided on the end portion of the flat circuitry.

3. A method for mounting a flat circuitry between a molded panel and a body panel of a vehicle while providing a surplus length portion of the flat circuitry, comprising the steps of:
    preparing an elastic strip member;
    fixing a first part of the flat circuitry onto the molded panel with a first end portion of the strip member; and
    retaining a second part of the flat circuitry which is in the vicinity of an end portion of the flat circuitry to be connected to the body panel with a second end portion of the strip member such that a portion of the flat circuitry between the second part and the end portion thereof becomes the surplus length portion and sliding movement of the flat circuitry relative to the elastic strip member is prevented.

* * * * *